(12) United States Patent
Chen et al.

(10) Patent No.: US 9,490,816 B2
(45) Date of Patent: Nov. 8, 2016

(54) PARAMETER CONTROL METHOD FOR INTEGRATED CIRCUIT AND INTEGRATED CIRCUIT USING THE SAME

(71) Applicant: EOSMEM CORPORATION, Zhubei, Hsinchu County (TW)

(72) Inventors: Tso-Min Chen, Zhubei (TW); Rong-Jie Tu, Zhubei (TW)

(73) Assignee: EOSMEM Corp., Zhubei, Hsinchu County (TW)

( * ) Notice: Subject to any disclaimer, the term of this patent is extended or adjusted under 35 U.S.C. 154(b) by 0 days.

(21) Appl. No.: 14/715,192

(22) Filed: May 18, 2015

(65) Prior Publication Data

US 2016/0156359 A1    Jun. 2, 2016

(30) Foreign Application Priority Data

Nov. 27, 2014  (TW) .............................. 103141328 A (51) Int. Cl.
*H03L 5/02* (2006.01)
*G01R 31/04* (2006.01)

(52) U.S. Cl.
CPC ............... *H03L 5/02* (2013.01); *G01R 31/041* (2013.01)

(58) Field of Classification Search
CPC ............................. H03L 5/02; G01R 31/041
See application file for complete search history.

(56) References Cited

U.S. PATENT DOCUMENTS

2006/0245221 A1* 11/2006 Ohshima ........... H02M 7/53871
                                                      363/131

* cited by examiner

*Primary Examiner* — Emily P Pham
(74) *Attorney, Agent, or Firm* — Muncy, Geissler, Olds & Lowe, P.C.

(57) ABSTRACT

A parameter control method for an integrated circuit and an integrated circuit using the same are provided. The method includes the steps of: providing a correspondence between $1^{st}$ to $N^{th}$ impedance groups and $1^{st}$ to $N^{th}$ first settings, wherein each impedance group includes K sub impedances; providing a correspondence between $1^{st}$ to $K^{th}$ sub-impedance and $1^{st}$ to $K^{th}$ second settings; detecting an impedance from a specific pin of the integrated circuit; comparing an impedance detected from the specific pin of the integrated circuit with the 1st to $N^{th}$ impedance sets to find a corresponding specific impedance set to select a specific first setting; comparing the impedance detected from the specific pin of the integrated circuit with the $1^{st}$ to $K^{th}$ sub-impedance of the specific impedance set to select a specific second setting; and operating the integrated circuit according to the specific first setting and the specific second setting.

6 Claims, 6 Drawing Sheets

PARAMETER CONTROL METHOD FOR INTEGRATED CIRCUIT AND INTEGRATED CIRCUIT USING THE SAME

BACKGROUND OF THE INVENTION

1. Field of Invention

The present invention relates in general to the technology of integrated circuit, and more particularly to a parameter control method for an integrated circuit and an integrated circuit using the same.

2. Related Art

After invention of transistor and mass production, all kinds of solid-state semiconductor components, such as diodes, transistors, etc., are used to replace the role of vacuum function in the circuit. In the late 20th century, since the development of semiconductor manufacturing technology, integrated circuits become possible. Comparing with the manual assembly of circuits using discrete individual electronic components, integrated circuit can integrate a large number of micro transistors into a small chip, which is an enormous advance. Production capacity, reliability, modular circuit design method of integrated circuit ensures the replacement for using discrete transistors by standardized integrated circuit design.

Integrated circuits have been widely be used in almost all electrical and electronic equipments or devices, to perform a lot of functions, such as storage, microprocessor, logic, analog and other individual components. Its applications are generally divided into computers and its peripheral equipment, office automation equipments, consumer products, telecommunications, automotive, industrial and so on.

Figure 1:
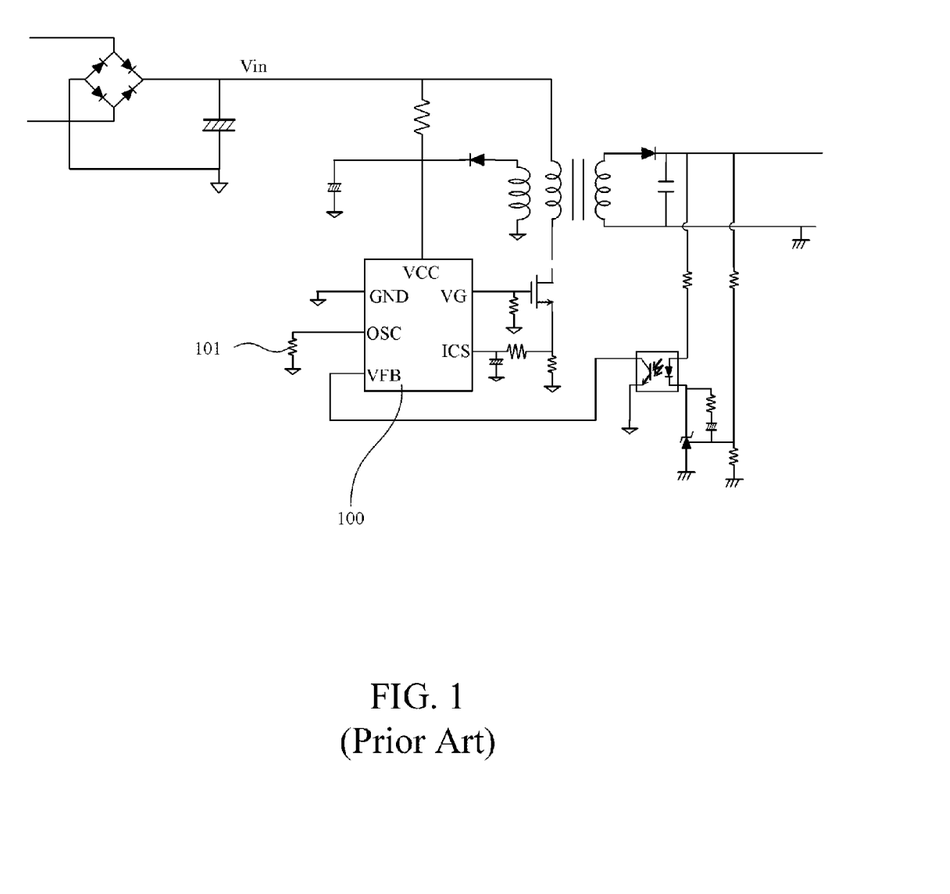
FIG. 1 illustrates the pin diagram depicting the pins of the integrated circuit according to the prior art.

In general integrated circuit, even if the circuits are almost the same, based on different vendors, different applications, they need different setting, such as operating frequency and the like. However, to product those integrated circuits, which have substantially the same operation and different setting, it does not conform to cost effectiveness. Therefore, integrated circuits often provide a specific pin for operation setting. FIG. 1 illustrates the pin diagram depicting the pins of the integrated circuit according to the prior art. Referring to FIG. 1, the integrated circuit 100 is used for power control. The pins includes a gate control pin VG, a current sense pin ICS, a power pin VCC, a ground pin GND, a feedback pin FB and a switching frequency control pin OSC. The gate control pin VG outputs the pulse width modulation signal PWM for controlling the conduction of the main switch. The feedback pin FB is used for receiving the feedback signal. The power pin VCC and the ground pin GND is used for receiving the operation voltage of the integrated circuit 100. The switching frequency control pin OSC is used for determining the operation frequency of the integrated circuit 100 according to the impedance of the frequency determine circuit 101 which is coupled to the switching frequency control pin OSC.

Designer can control the operation frequency of the power control integrated circuit according to the switching frequency control pin OSC. However, one setting of the integrated circuit needs one pin to be occupied. If multiple settings would be set, multiple pins are wasted and the volume of the product would be increased. Thus, Applicants provides a method to use one pin to perform multiple settings.

SUMMARY OF THE INVENTION

An objective of the present invention is to provide a parameter control method for an integrated circuit and an integrated circuit using the same, wherein the lesser pins are adopted to control multiple settings of the integrated circuit.

In order to achieve said objective and others, the present invention provides a parameter control method, adapted for control internal parameters of an integrated circuit without increasing its pin counts. The method includes the steps of: providing a corresponding relationship between a first to $N^{th}$ impedance sets and a first to $N^{th}$ first settings, wherein each impedance set comprises K sub-impedances; providing a corresponding relationship between a first to $K^{th}$ sub-impedances and the a first to $K^{th}$ second settings; detecting an impedance of a specific pin; finding a specific impedance set by comparing the detected impedance of the specific pin with the first to $N^{th}$ impedance sets to select a specific first setting; finding a specific sub-impedance by comparing the detected impedance of the specific pin with the first to $K^{th}$ sub-impedances of the specific impedance set to select a specific second setting; and operating the integrated circuit according to the specific first setting and the specific second setting, wherein N and K are natural numbers.

The present invention further provides an integrated circuit. The integrated circuit includes a setting pin, an impedance measurement circuit and an impedance-setting conversion circuit. The impedance measurement circuit is coupled to the setting pin for detecting an impedance of the setting pin. The impedance-setting conversion circuit is coupled to the impedance measurement circuit for determining an operation setting of the integrated circuit according to the impedance of the setting pin, wherein the impedance-setting conversion circuit stores a corresponding relationship between a first to $N^{th}$ impedance sets and a first to $N^{th}$ first settings, wherein each impedance set comprises K sub-impedances, wherein the impedance-setting conversion circuit stores a corresponding relationship between a first to $K^{th}$ sub-impedances and a first to $K^{th}$ second settings. Moreover, the impedance-setting conversion circuit finds a specific impedance set by comparing the detected impedance of the specific pin with the first to $N^{th}$ impedance sets to select a specific first setting. Beside, the impedance-setting conversion circuit finds a specific sub-impedance by comparing the detected impedance of the specific pin with the first to $K^{th}$ sub-impedances of the specific impedance set to select a specific second setting. After that, the integrated circuit operates according to the specific first setting and the specific second setting, wherein N and K are natural numbers.

In accordance with the exemplary embodiments of the present invention, the integrated circuit further includes a second setting pin, wherein the second setting pin is coupled to the impedance measurement circuit, and the impedance measurement circuit is used for detecting an impedance of the second setting pin, wherein the impedance-setting conversion circuit stores a corresponding relationship between a first to $N^{th}$ second impedance sets and a first to Nth third settings, wherein each second impedance set comprises $K^{th}$ second sub-impedance. Further, the impedance-setting conversion circuit stores a corresponding relationship between a first to $K^{th}$ sub-impedance, a first to $K^{th}$ second sub-impedance and $K^2$ second settings, wherein $I^{th}$ sub-impedance and $J^{th}$ second sub-impedance are corresponding to the $(I, J)^{th}$ second setting. The impedance measurement circuit detects a impedance of the second specific pin. The impedance-setting conversion circuit finds a specific second impedance set by comparing the detected impedance of the specific pin and the first to $N^{th}$ second impedance sets to select a specific third setting. The impedance-setting conversion circuit finds a specific sub-impedance by comparing the detected impedance of the specific pin and the first to $K^{th}$ impedances of the specific impedance set and finding a specific second sub-impedance by comparing the detected impedance of the second specific pin and the first to $K^{th}$ impedances of the specific second impedance set to select the specific second setting.

In accordance with the exemplary embodiments of the present invention, the integrated circuit is a power control integrated circuit, and the specific pin is a switch control pin, wherein the impedance of the specific pin is a comprises a impedance of a floating preventing resistor, wherein the second specific pin is a current sense pin, and the impedance of the second specific pin is a impedance of a resistor of a low pass filter coupled to the current sense pin, wherein the parameter control method is performed at the start-up of the power control integrated circuit.

The spirit of the present invention is to configure an impedance-setting conversion circuit in the integrated circuit. Further, in the impedance-setting conversion circuit, the corresponding relationship between N impedance sets and N first settings is configured. Moreover, each impedance set can be divided K impedances, and K impedances corresponds to K second settings. As such, the designer can design multiple settings in the integrated circuit with few pins. Thus, the requirement of the integrated circuit can be reduced.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

The present invention will be apparent from the following detailed description, which proceeds with reference to the accompanying drawings, wherein the same references relate to the same elements.

The present invention will become more fully understood from the detailed description given hereinafter and the accompanying drawings are given by way of illustration only, and thus are not limitative of the present invention.

In the specification and claim them before Certain terms are used to refer to a specific element. Those skilled in the art will appreciate that the hardware manufacturers may use different terms to refer to the same elements. Prior to this specification and claims are not to differences in the name as a way to distinguish one element, but rather differences in the functional element as a criterion to distinguish. Throughout the rights referred to in the specification and requirements before them and the "contained" as an open-ended term, it should be interpreted as "including but not limited to." Furthermore, "coupled" as used in this contain any direct or indirect electrical connection means. Accordingly, if one device is coupled to a second device, the first device on behalf of the directly electrically connected to the second device, or through other means or indirectly to the electrical connecting means connected to the second device.

First Embodiment

Figure 2:
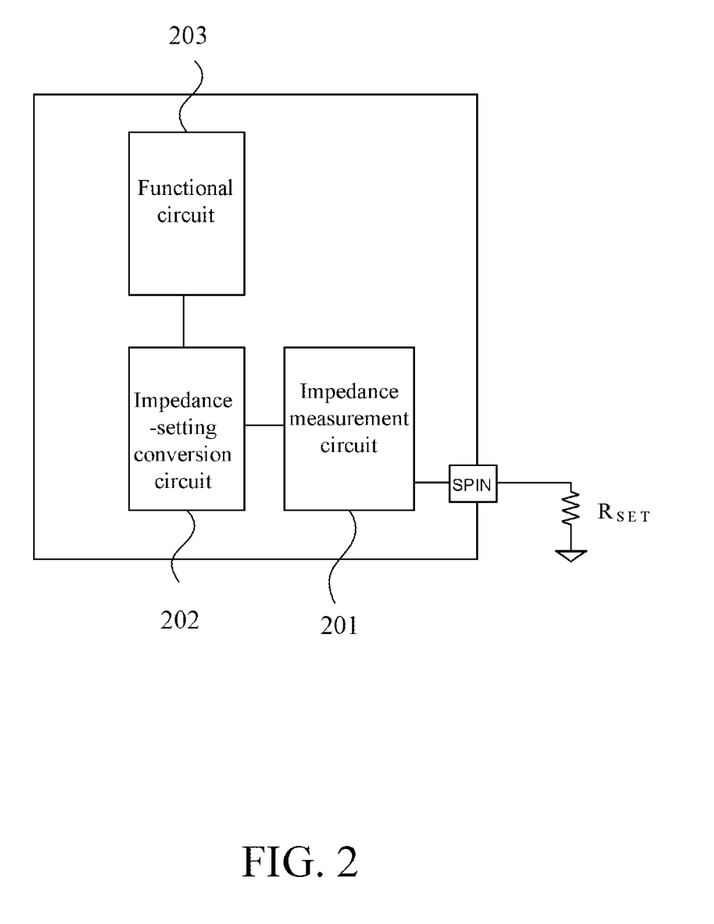
FIG. 2 illustrates a circuit block diagram depicting an integrated circuit according to a first embodiment of the present invention.

FIG. 2 illustrates a circuit block diagram depicting an integrated circuit according to a first embodiment of the present invention. Referring to FIG. 2, the integrated circuit includes a setting pin SPIN, an impedance measurement circuit 201, an impedance-setting conversion circuit 202 and a functional circuit 203. In order to conveniently describe the spirit of the present invention, a setting resistor $R_{SET}$ is illustrated in FIG. 2.

Table 1 represents a corresponding relationship between the impedances and settings stored in the impedance-setting conversion circuit 202. In the first embodiment, the first impedance set Group1 includes 16 KΩ and 18 KΩ; the second impedance set Group2 includes 20 KΩ and 22 KΩ; the third impedance set Group3 includes 24 KΩ and 27 KΩ. Since there are three impedance sets, the first setting has three options, which respectively are a first option S11, a second option S12 and a third option S13. Each impedance set includes two sub-impedances. Thus, the second setting has two options, which respectively are a first option S21 and a second option S22.

TABLE 1

|  | Group1 | | Group2 | | Group3 | |
| --- | --- | --- | --- | --- | --- | --- |
| $R_{SET}$ | 16 KΩ | 18 KΩ | 20 KΩ | 22 KΩ | 24 KΩ | 27 KΩ |
| First Setting | S11 | | S12 | | S13 | |
| Second Setting | S21 | S22 | S21 | S22 | S21 | S22 |

It is assumed that the product designer needs that the integrated circuit is operated according to the second option S12 of the first setting and the first option S21 of the second setting. The product designer only needs to couple 20 KΩ setting resistor $R_{SET}$ to the setting pin SPIN. After that, when the impedance measurement circuit 201 of the integrated circuit measures that the setting resistor is 20 KΩ, the impedance measurement circuit 201 would notify the impedance-setting conversion circuit 202 of the measurement result being 20 KΩ. The impedance-setting conversion circuit 202 may perform a table look-up to find that 20 KΩ corresponds to the second impedance set and the first sub-impedance of the second impedance set. The impedance-setting conversion circuit 202 outputs the control signal CTRL to the functional circuit 203 such that the integrated circuit is operated according to the second option S12 of the first setting and the first option S21 of the second setting

Second Embodiment

Figure 3:
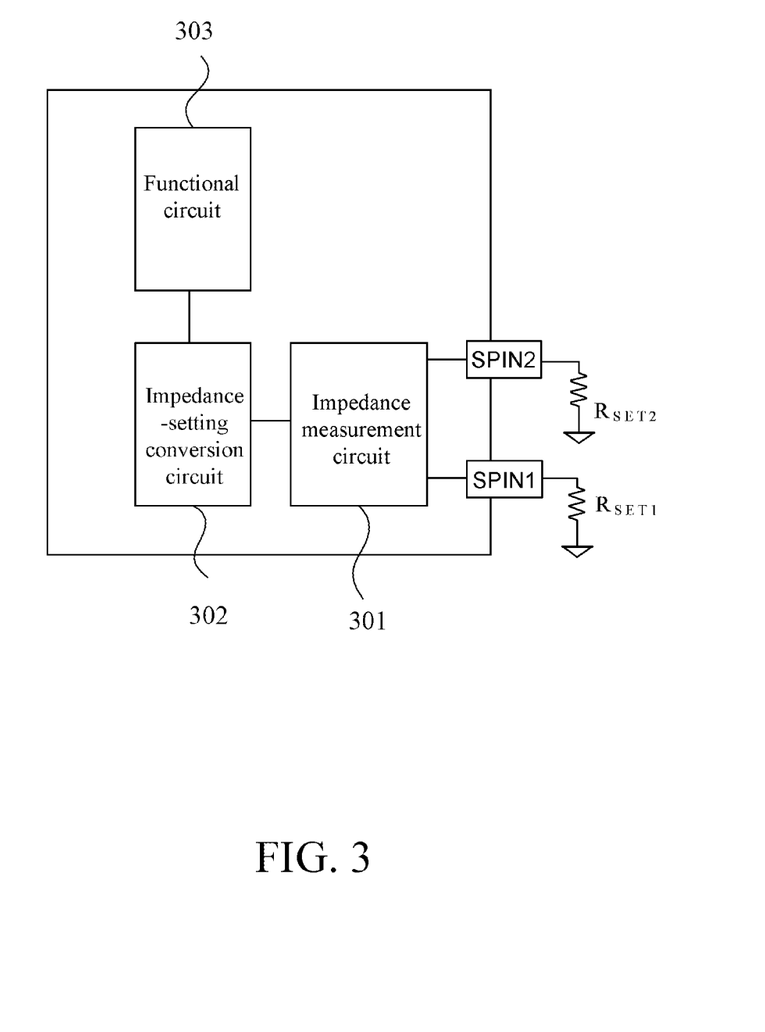
FIG. 3 illustrates a circuit block diagram depicting an integrated circuit according to a second embodiment of the present invention.

FIG. 3 illustrates a circuit block diagram depicting an integrated circuit according to a second embodiment of the present invention. Referring to FIG. 3, the integrated circuit includes a first setting pin SPIN1, a second setting pin SPIN2, a impedance measurement circuit 301, a impedance-setting conversion circuit 302 and a functional circuit 303. In order to conveniently describe the spirit of the present invention, a first setting resistor $R_{SET1}$ and a second setting resistor $R_{SET2}$ are illustrated in FIG. 3.

Table 2 represents the a corresponding relationship between the impedances and first setting, second setting stored in the impedance-setting conversion circuit 202 according to the second embodiment of the present invention. In the second embodiment, the first impedance set of the first setting includes 16 KΩ and 18 KΩ; the second impedance set of the first setting includes 20 KΩ and 22 KΩ; the third impedance set of the first setting includes 24 KΩ and 27 KΩ. Since there are three impedance sets, the first setting has three options, which respectively are a first option S11, a second option S12 and a third option S13. The first impedance set of the second setting includes 20 KΩ and 24 KΩ; the second impedance set of the second setting includes 30 KΩ and 36 KΩ; the third impedance set of the second setting includes 43 KΩ and 47 KΩ. Since there are three impedance sets, the second setting also has three options, which respectively are a first option S21, a second option S22 and a third option S23.

TABLE 2

|  | GROUP1 | | GROUP2 | | GROUP3 | |
|---|---|---|---|---|---|---|
| $R_{SET1}$ | 16 KΩ | 18 KΩ | 20 KΩ | 22 KΩ | 24 KΩ | 27 KΩ |
| First Setting | S11 | | S12 | | S13 | |
|  | Group1 | | Group2 | | Group3 | |
| $R_{SET2}$ | 20 KΩ | 24 KΩ | 30 KΩ | 36 KΩ | 43 KΩ | 47 KΩ |
| Second Setting | S21 | | S22 | | S23 | |

TABLE 3

| Third Setting | $R_{SET1}L$ | $R_{SET1}H$ |
|---|---|---|
| $R_{SET2}L$ | LL | HL |
| $R_{SET2}H$ | LH | HH |

Table 3 represents a corresponding relationship between the third setting and the impedances stored in the impedance-setting conversion circuit 202. According to the Table 2, each impedance set includes two sub-impedances. In this embodiment, each sub-impedance respectively represents logic H and logic L. Thus, the third setting has four options, which respectively are a first option LL, a second option LH, a third option HL and a fourth option HH.

It is assumed that the product designer needs that the integrated circuit is operated according to the second option S12 of the first setting, the third option S21 of the second setting and the fourth option of the third setting. The product designer only needs to couple the 22 KΩ first setting resistor $R_{SET1}$ to the first setting pin SPIN1 and to couple the 47 KΩ second setting resistor $R_{SET2}$ to the second setting pin SPIN2. After that, the impedance measurement circuit 301 of the integrated circuit would measure that the first setting resistor $R_{SET1}$ is 22 KΩ and the second setting resistor $R_{SET2}$ is 47 KΩ, and then the impedance measurement circuit 301 would notify the impedance setting conversion circuit 302 of the measurement result. The impedance setting conversion circuit 302 may perform the table look-up to find that 22 KΩ corresponds to the second impedance set and the second sub-impedance of the second impedance set. Similarly, the impedance setting conversion circuit 302 would find that 47 KΩ corresponds to the third impedance set and the second sub-impedance of the third impedance set. And then, the impedance setting conversion circuit 302 outputs the control signal CTRL to the functional circuit 203 such that the integrated circuit is operated according to the second option S12 of the first setting, the third option S21 of the second setting and the fourth option HH of the third setting.

According to the abovementioned embodiments, the present invention can has more settings by using lower pin counts. In addition, in the abovementioned embodiment, each impedance set has two impedances; the third setting thus only has four options. However, people having ordinary skill in the art should know that the third setting would have nine options when each impedance set has three impedances according to the abovementioned embodiment. Thus, the present invention is not limited thereto.

In the abovementioned embodiment, it is read that the three settings are adopted in the integrated circuit. However, people having ordinary skill in the art should know that the present invention can perform four setting by using two pins. However, in the present embodiment, in order to increase the options of the third setting, the fourth setting is abandoned. It is the trade-off of design. The detail description is omitted.

Third Embodiment

Figure 4:
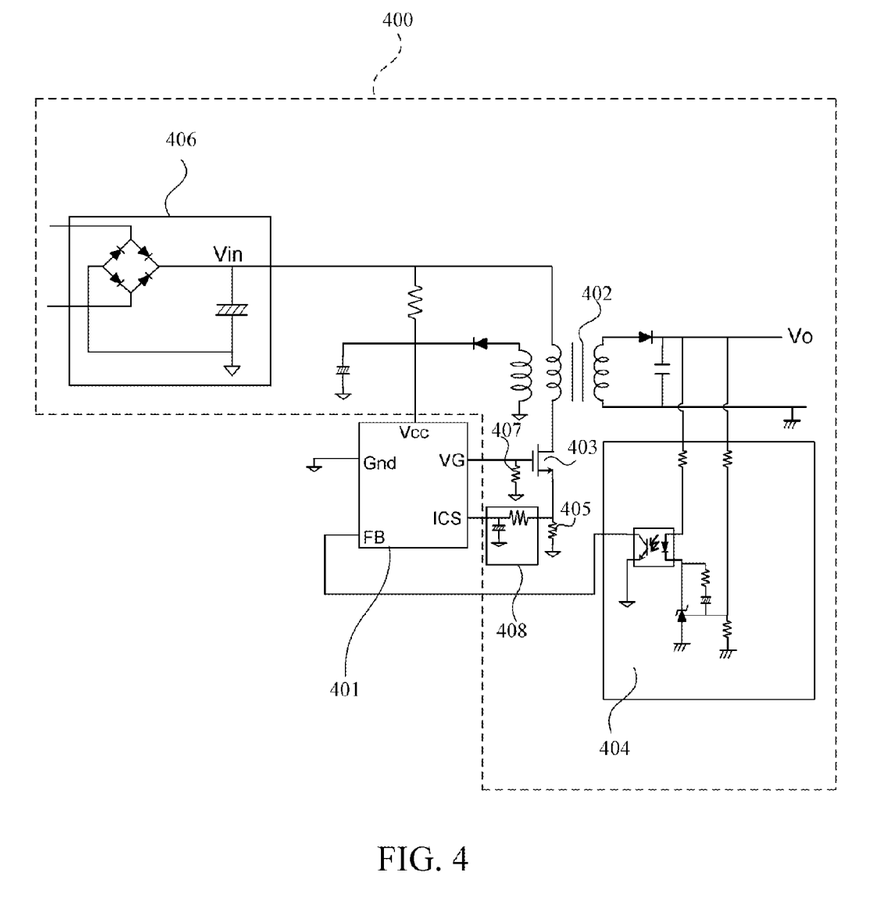
FIG. 4 illustrates a circuit block diagram depicting a power supply according to a third embodiment of the present invention.

The abovementioned embodiment adopts the more generalized way to illustrate the present invention. In the following embodiment, the power control integrated circuit for control the power supply is adopted for describing the spirit of the present invention. FIG. 4 illustrates a circuit block diagram depicting a power supply according to a third embodiment of the present invention. Referring to FIG. 4, the power supply includes a power converter 400 and the power control integrated circuit 401 of the preferred embodiment of the present invention. The power converter 400 includes a transformer 402, a switch 403, a feedback circuit 404, a current sense resistor 405, a rectifier circuit 406, a floating preventing resistor 407 and a RC low pass filter 408. The power control integrated circuit 401 includes a switch control pin VG, a current sense pin ICS, a power pin VCC, a ground pin GND and a feedback pin FB.

The current sense resistor 405 is coupled between the switch 403 and ground, for performing current compensation. The drain terminal of the switch 403 is coupled to the primary side of the transformer 402. The source terminal of the switch 403 is coupled to the current sense resistor 405. The gate terminal of the switch 403 is coupled to the switch control pin VG of the power control integrated circuit 401. The floating preventing resistor 407 is coupled between the gate terminal of the switch 403 and the ground, for preventing the floating of the gate terminal of the switch 403. The RC low pass filter 408 is coupled between the current sense resistor 405 and the current sense pin ICS of the power control integrated circuit 401, for performing low pass filter to the current sense signal to remove its noise.

Figure 5:
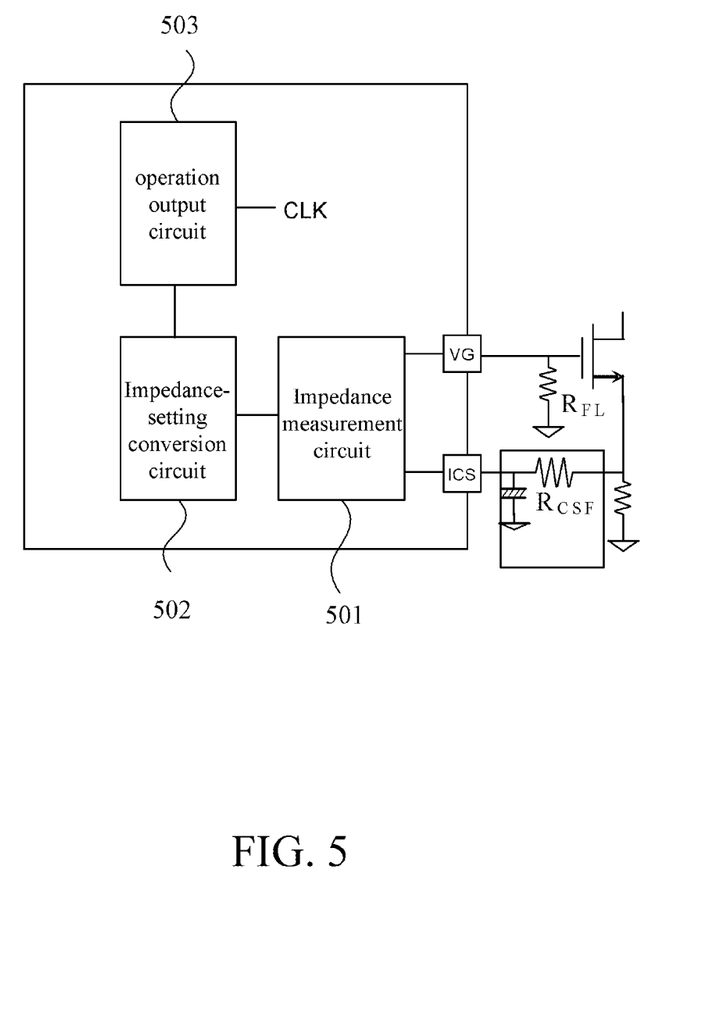
FIG. 5 illustrates a circuit block diagram depicting a power control integrated circuit according to a third embodiment of the present invention.

In the abovementioned third embodiment, the power control integrated circuit 401 does not have parameter control pin. How to set the parameters is described in the following embodiment. FIG. 5 illustrates a circuit block diagram depicting a power control integrated circuit according to a third embodiment of the present invention. Referring to FIG. 5, in this embodiment, the power control integrated circuit includes a switch control pin VG, a current sense pin ICS, a impedance measurement circuit 501, a impedance-setting conversion circuit 502 and an operation output circuit 503.

The switch control pin VG is used for coupling the gate terminal of the switch 403. The current sense pin ICS is used for coupling the output terminal of the RC low pass filter 408. The impedance measurement circuit 501 is coupled to the switch control pin VG and the current sense pin ICS, for detecting the impedances of the switch control pin VG and the current sense pin ICS when the power integrated circuit starts up. The impedance-setting conversion circuit 502 is coupled to the impedance measurement circuit 501. In this embodiment, the impedance-setting conversion circuit 502 utilizes a look up table for example. The look up table stores the corresponding relationship between the switching frequencies and the impedances of the switch control pin VG and current sense pin ICS.

For example, in the present embodiment, the switching frequency, the time to enter the over current protection and the feedback voltage to enter the power saving mode should be set up in the power control integrated circuit 401. Similarly, in the present embodiment, two resistors, which can be changed without affecting the operation of the circuit, are adopted to be the setting resistors. According to the abovementioned circuit, the floating preventing resistor 407 can be changed without affecting the operation of the circuit. Moreover, the resistor of the low pass filter 408 coupled to the current sense pin ICS also belongs to a changeable resistor without affecting the operation of the circuit. As such, the third embodiment adopts the abovementioned resistors to perform the settings of the power control integrated circuit.

TABLE 4

|  | S1L | S1H | S2L | S2H | S3L | S3H |
|---|---|---|---|---|---|---|
| $R_{FL}$ | 16K | 18K | 20K | 22K | 24K | 27K |
| FSW |  | 60 KHz |  | 80 KHz |  | 100 KHz |
|  | M1L | M1H | M2L | M2H | M3L | M3H |
| $R_{CSF}$ | 20K | 24K | 30K | 36K | 43K | 47K |
| OCP |  | 500 ms |  | 1000 ms |  | 1500 ms |

Table 4 represents the corresponding relationship between the settings and the impedances stored in the impedance-setting conversion circuit 502. In the table 4, FSW represent the switching frequency; OCP represent over current protection; $R_{FL}$ represents the value of the floating preventing resistor; $R_{CSF}$ represents the value of the resistor of the low pass filter. According to the table 4, the floating preventing resistor $R_{FL}$ can be used to select the switching frequency from 60 KHz, 80 KHz and 100 KHz. In addition, according to the table 4, the resistor $R_{CSF}$ of the low pass filter can be used to select the time to enter the over current protection from 500 ms, 1000 ms and 1500 ms.

Table 5 represents a corresponding relationship between the resistors in table 4 and feedback voltage of the programmable power saving mode. Referring to table 5, VFB represents feedback voltage, wherein the feedback voltage relates to the load of the power supply. Next, referring to table 4 and table 5, in table 4, S1L is 16 KΩ, S1H is 18 KΩ, and S1L and S1H correspond to 60 KHz; M1L is 20 KΩ, M1His 24 KΩ, and M1L and M1H correspond to 500 ms. However, according to table 5, when the impedance $R_{FL}$ measured from the switch control pin VG is 16 KΩ, and the impedance $R_{CSF}$ measured from the current sense pin ICS is 20 KΩ, the feedback voltage of the power saving mode is V1, that is, when the feedback voltage reaches V1, the power control integrated circuit 401 enters the power saving mode. Similarly, when impedance $R_{FL}$ measured from the switch control pin VG is 22 KΩ, and the impedance $R_{CSF}$ measured from the current sense pin ICS is 36 KΩ, the feedback voltage of the power saving mode is V4, that is, when the feedback voltage reaches V4, the power control integrated circuit 401 enters the power saving mode.

TABLE 5

| VFB | SL | SH |
|---|---|---|
| ML | V1 | V3 |
| MH | V2 | V4 |

Furthermore, in order not to affect the operation of the power control integrated circuit 401, the impedance measurement circuit 501, the impedance-setting conversion circuit 502 and the operation output circuit 503, in this embodiment, are operated at the start-up of the power control integrated circuit 401 to measure the resistances of the floating preventing resistor RFL and the resistor RCSF of the low pass filter to finish the abovementioned settings.

According to the abovementioned description, since the pins and elements are the original required elements of the power supply and the values of the floating preventing resistor 407 and the resistor of the RC low pass filter 408 are flexible, designer can set three settings by selecting the values of the resistors according to the table 4 and table 5. In addition, the overall circuit operation is not affected by changing the resistors.

Besides, since the value of the current sense resistor generally is between 0.3Ω to 1Ω, the measured impedance of the impedance measurement circuit 401 is equivalent to the impedance of the RC low pass filter. Comparing the impedance of the current sense resistor with the impedance of the resistor of the RC low pass filter, the impedance of the current sense resistor can be ignored.

In the abovementioned embodiment, the setting of the power control integrated circuit is performed when the power control integrated circuit starts up. However, the abovementioned embodiment only shows the preferred embodiment. People having ordinary skill in the art should know that the integrated circuit can be set up in a non-startup time. It may be set up in a normal operation time. The present invention is not limited thereto.

Fourth Embodiment

Figure 6:
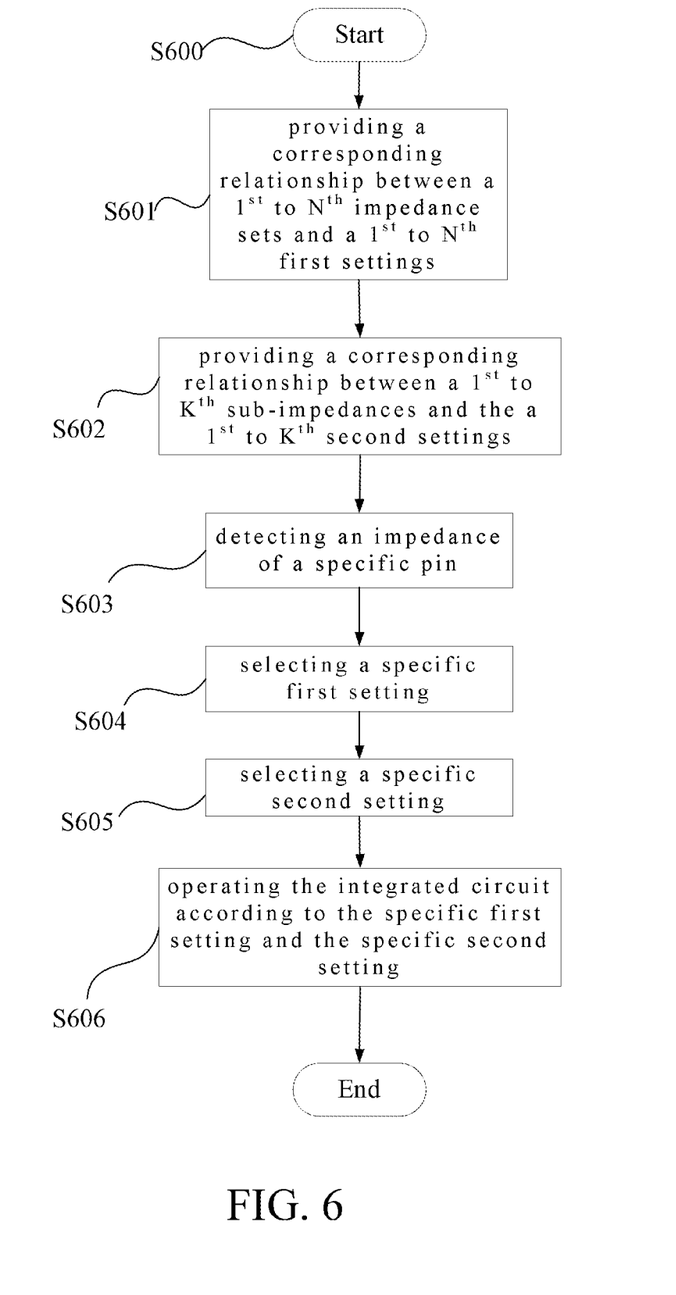
FIG. 6 illustrates a flow chart depicting a parameter control method according to a fourth embodiment of the present invention.

According to the abovementioned embodiments, the present invention can be summarized to a parameter control method. FIG. 6 illustrates a flow chart depicting a parameter control method according to a fourth embodiment of the present invention. Referring to FIG. 6, the parameter control method includes the steps as follow.

In step S600, the method starts.

In step S601, a corresponding relationship between a first to $N^{th}$ impedance sets and a first to $N^{th}$ first settings is provided, wherein each impedance set comprises K sub-impedances.

In step S602, a corresponding relationship between a first to $K^{th}$ sub-impedances and a first to $K^{th}$ second settings is provided.

In step S603, an impedance of a specific pin is detected.

In step S604, a specific impedance set is found by comparing the detected impedance of the specific pin and the first to $N^{th}$ impedance sets to select a specific first setting.

In step S605, specific sub-impedance is found by comparing the detected impedance of the specific pin and the first to $K^{th}$ impedances of the specific impedance set to select a specific second setting.

In step S605, the integrated circuit is operated according to the specific first setting and the specific second setting.

Similarly, when there are two pins, the abovementioned method would further include the third setting, even the fourth setting, as the abovementioned second embodiment. The detail description is omitted.

In summary, the spirit of the present invention is to configure an impedance-setting conversion circuit in the integrated circuit. Further, in the impedance-setting conversion circuit, the corresponding relationship between N impedance sets and N first settings is configured. Moreover, each impedance set can be divided K impedances, and K impedances correspond to K second settings. As such, the designer can design multiple settings in the integrated circuit with few pins. Thus, the requirement of the integrated circuit can be reduced.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art. It will be apparent that various changes and modifications can be made without departing from the spirit and scope of the invention as defined in the appended claims.

What is claimed is:

1. A parameter control method, adapted for control internal parameters of an integrated circuit without increasing its pin counts, wherein the method comprises:

providing a corresponding relationship between a first to $N^{th}$ impedance sets and a first to $N^{th}$ first settings, wherein each impedance set comprises K sub-impedances;

providing a corresponding relationship between a first to $K^{th}$ sub-impedances and a first to $K^{th}$ second settings;

detecting an impedance of a specific pin;

finding a specific impedance set by comparing the detected impedance of the specific pin with the first to $N^{th}$ impedance sets to select a specific first setting;

finding a specific sub-impedance by comparing the detected impedance of the specific pin with the first to $K^{th}$ sub-impedances of the specific impedance set to select a specific second setting; and operating the integrated circuit according to the specific first setting and the specific second setting, wherein N and K are natural numbers.

2. The parameter control method according to the claim 1, wherein the integrated circuit further comprises a second specific pin, wherein the method further comprises:

providing a corresponding relationship between a first to $N^{th}$ second impedance sets and a first to $N^{th}$ third settings, wherein each second impedance set comprises K second sub-impedances;

providing a corresponding relationship between a first to $K^{th}$ sub-impedances, a first to $K^{th}$ second sub-impedances and $K^2$ second settings, wherein $I^{th}$ sub-impedance and $J^{th}$ second sub-impedance are corresponding to the $(I, J)^{th}$ second setting;

detecting an impedance of the second specific pin;

finding a specific second impedance set by comparing the detected impedance of the second specific pin with the first to $N^{th}$ second impedance sets to select a specific third setting; and finding a specific sub-impedance by comparing the detected impedance of the specific pin with the first to $K^{th}$ impedances of the specific impedance set and finding a specific second sub-impedance by comparing the detected impedance of the second specific pin with the first to $K^{th}$ impedances of the specific second impedance set to select the specific second setting, wherein I and J are natural number.

3. The parameter control method according to the claim 2, wherein the integrated circuit is a power control integrated circuit, and the specific pin is a switch control pin, wherein the impedance of the specific pin is an impedance of a floating preventing resistor, wherein the second specific pin is a current sense pin, and the impedance of the second specific pin is an impedance of a resistor of a low pass filter coupled to the current sense pin, wherein the parameter control method is performed at the start-up of the power control integrated circuit.

4. An integrated circuit, comprising:

a setting pin;

an impedance measurement circuit, coupled to the setting pin, for detecting an impedance of the setting pin; and an impedance-setting conversion circuit, coupled to the impedance measurement circuit, for determining an operation setting of the integrated circuit according to the impedance of the setting pin, wherein the impedance-setting conversion circuit stores a corresponding relationship between a first to $N^{th}$ impedance sets and a first to $N^{th}$ first settings, wherein each impedance set comprises K sub-impedances;

wherein the impedance-setting conversion circuit stores a corresponding relationship between a first to $K^{th}$ sub-impedances and a first to $K^{th}$ second settings;

wherein the impedance-setting conversion circuit finds a specific impedance set by comparing the detected impedance of the specific pin with the first to $N^{th}$ impedance sets to select a specific first setting;

wherein the impedance-setting conversion circuit finds a specific sub-impedance by comparing the detected impedance of the specific pin with the first to $K^{th}$ sub-impedances of the specific impedance set to select a specific second setting; and wherein the integrated circuit operates according to the specific first setting and the specific second setting, wherein N and K are natural numbers.

5. The integrated circuit according to the claim 4, further comprising:

a second setting pin, wherein the second setting pin is coupled to the impedance measurement circuit, and the impedance measurement circuit is used for detecting an impedance of the second setting pin;

wherein the impedance-setting conversion circuit stores a corresponding relationship between a first to $N^{th}$ second impedance sets and a first to $N^{th}$ third settings, wherein each second impedance set comprises K second sub-impedances;

wherein the impedance-setting conversion circuit stores a corresponding relationship between a first to $K^{th}$ sub-impedances, a first to $K^{th}$ second sub-impedances and $K^2$ second settings, wherein $I^{th}$ sub-impedance and $J^{th}$ second sub-impedance are corresponding to the $(I, J)^{th}$ second setting;

wherein the impedance measurement circuit detects an impedance of the second specific pin;

wherein the impedance-setting conversion circuit finds a specific second impedance set by comparing the detected impedance of the second specific pin with the first to $N^{th}$ second impedance sets to select a specific third setting; and wherein the impedance-setting conversion circuit finds a specific sub-impedance by comparing the detected impedance of the specific pin with the first to $K^{th}$ impedances of the specific impedance set and finding a specific second sub-impedance by comparing the detected impedance of the second specific pin with the first to $K^{th}$ impedances of the specific second impedance set to select the specific second setting, wherein I and J are natural number.

6. The integrated circuit according to the claim 5, wherein the integrated circuit is a power control integrated circuit, and the specific pin is a switch control pin, wherein the impedance of the specific pin is an impedance of a floating preventing resistor, wherein the second specific pin is a current sense pin, and the impedance of the second specific pin is an impedance of a resistor of a low pass filter coupled to the current sense pin, wherein the parameter control method is performed at the start-up of the power control integrated circuit.

* * * * *